United States Patent
Lam et al.

(10) Patent No.: US 8,618,860 B2
(45) Date of Patent: *Dec. 31, 2013

(54) SYSTEM AND METHOD OF TRANSISTOR SWITCH BIASING IN A HIGH POWER SEMICONDUCTOR SWITCH

(71) Applicant: SiGe Semiconductor Inc., Ottawa (CA)

(72) Inventors: Lui Lam, Winchester, MA (US); Hanching Fuh, Allston, MA (US)

(73) Assignee: SiGe Semiconductor Inc., Ottawa (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/709,366

(22) Filed: Dec. 10, 2012

(65) Prior Publication Data

US 2013/0099845 A1   Apr. 25, 2013

Related U.S. Application Data

(63) Continuation of application No. 12/833,543, filed on Jul. 9, 2010, now Pat. No. 8,330,519.

(51) Int. Cl.
  *H03L 5/00* (2006.01)

(52) U.S. Cl.
  USPC ............... 327/308; 327/365; 327/427

(58) Field of Classification Search
  USPC ......... 327/374, 472, 365, 376, 377, 427, 308, 327/103
  See application file for complete search history.

(56) References Cited

U.S. PATENT DOCUMENTS

| | | | |
|---|---|---|---|
| 5,617,055 A | 4/1997 | Confalonieri et al. | |
| 5,818,283 A | 10/1998 | Tonami et al. | |
| 7,123,898 B2 | 10/2006 | Burgener et al. | |
| 7,199,635 B2 | 4/2007 | Nakatsuka et al. | |
| 7,250,804 B2 | 7/2007 | Brindle | |
| 7,636,004 B2 | 12/2009 | Nakatsuka et al. | |
| 7,786,787 B2 * | 8/2010 | Brindle | 327/308 |
| 8,330,519 B2 * | 12/2012 | Lam et al. | 327/308 |
| 2009/0181630 A1 | 7/2009 | Seshita et al. | |
| 2010/0117713 A1 | 5/2010 | Katoh et al. | |

OTHER PUBLICATIONS

F.J. Huang et al., "A 0.5-μm CMOS T/R switch for 900-MHz Wireless Applications", IEEE J. Solid State Circuits, vol. 36, pp. 486-492, Mar. 2001, Gainsville, Florida, U.S.A.

F.J. Huang et al., "A 900-MHz T/R Switch with a 0.8-dB Insertion Loss Implemented in a 0.5-μm CMOS Process", IEEE 2000 Custom Integrated Circuits Conference, pp. 341-344, Gainsville, Florida, U.S.A.

T. Oknakado et al., "21.5 dBm Power-Handling 5 GHz Transmit/Receive CMOS Switch Realized by Voltage Division Effect of Stacked Transistor Configuration with Depletion-Layer-Extended Transistors (DETs)", 2003 Symposium on VLSI Circuits Digest of Technical Repairs, pp. 25-28, Kamakura, Kanagawa, Japan.

International Search Report for International application No. PCT/CA2011/000792 dated Oct. 14, 2011, 3 pgs.

* cited by examiner

*Primary Examiner* — Hai L Nguyen

(74) *Attorney, Agent, or Firm* — Knobbe, Martens, Olson & Bear, LLP

(57) ABSTRACT

A circuit and method are provided for switching in a semiconductor based high power switch. Complementary p-type based transistors are utilized along insertion loss insensitive paths allowing biasing voltages to alternate between supply and ground, allowing for negative voltage supplies and blocking capacitors to be dispensed with, while improving performance.

20 Claims, 2 Drawing Sheets

SYSTEM AND METHOD OF TRANSISTOR SWITCH BIASING IN A HIGH POWER SEMICONDUCTOR SWITCH

This application is a continuation of U.S. application Ser. No. 12/833,543 filed on Jul. 9, 2010 and titled "SYSTEM AND METHOD OF TRANSISTOR SWITCH BIASING IN A HIGH POWER SEMICONDUCTOR SWITCH" the entirety of which is incorporated herein by reference to form a part of this specification.

BACKGROUND

The invention relates to high power semiconductor switches, and more particularly to FET switch layouts and biasing thereof.

In modern RF communication systems, a semiconductor-based transmit-receive switch is often the last/first component encountered by a transmitted/received signal before/after encountering an antenna.

Many of the main advances in semiconductor-based transmit-receive switches have been with respect to isolation and insertion loss. Groups of FETs are arranged in the switch along with judiciously chosen resistors and capacitors to ensure low insertion loss along the signal path and high isolation from the off paths. One general approach utilizes, instead of a single FET switch along each alternative path, a group of FET switches in series. This general approach moreover does not simply turn the FETs on and off by utilizing only a voltage at the gate, but instead biases both the gate and the source/drain in a forward and reverse manner to turn the FETs full-on and full-off respectively. Two general approaches have been used to enable this, namely, the use of negative voltage sources, and the use of DC blocking capacitors.

In both known approaches n-FETs are used due to their lower insertion loss and low harmonics while p-FETs are avoided due to their higher insertion loss caused in part by the relative low mobility of holes in a p-FET compared with the relatively higher electron mobility in an n-FET. The FETs described herein are MOSFETs which include a gate, a source, a drain and a backgate. For n-FETs which are nMOSFETs as depicted in FIGS. 1A and 1B, in order for the transistor to be fully on, the voltage applied to the backgate should be the substantially similar to that applied to the source and the drain, while the voltage at the gate must be higher, in the case of silicon on insulator (SOI), than the voltage at the source or drain by 2.5V. In order for the SOI n-FET to be properly off, the voltage at the backgate should be less than the voltage at the drain and the source, and the voltage at the gate should be less than the voltage at the drain or the source. Harmonic generation occurs when the depletion region of the parasitic diodes associated with the n-FET devices are modulated by a signal when it passes through the n-FET.

An example of a known series-shunt switch 100 according to a prior art approach utilizing negative voltage sources for biasing is presented in FIG. 1A. An RF terminal 101 is coupled along a signal or series path 111 through a series FET group switch 110 to an antenna 102, and is connected along a shunt path 121 through a shunt FET group switch 120 to ground 103. Each FET group switch 110, 120 has a group of n-FET transistors connected in series with the respective path from the RF terminal 101 to the antenna 102 or from the RF terminal 101 to ground 103. Each FET group switch 110, 120 also has a respective associated group of source/drain resistors 115, 125, each resistor of which is coupled to a sources and drain of a respective FET of the group switch it is associated with.

The gates of the FETs of the series FET group switch 110 are biased by a series gate biasing terminal 112 with a voltage $V_{gSERIES}$, while gates of the FETs of the shunt FET group switch 120 are biased by a shunt gate biasing terminal 122 with a voltage $V_{gSHUNT}$. The backgates of the FETs of the series FET group switch 110 are biased by a series backgate biasing terminal 114 with a voltage $V_{bSERIES}$, while backgates of the FETs of the shunt FET group switch 120 are biased by a shunt backgate biasing terminal 124 with a voltage $V_{bSHUNT}$. All of the sources and drains of the series FET group switch are effectively biased at the same DC voltage level of the RF terminal 101, ground 103, and the antenna 102 which is 0.0V.

To connect the RF terminal 101 to the antenna 102 and put the switch 100 into series mode, the series gate biasing terminal 112 is set to $V_{gSERIES}=2.5V$, while the series backgate biasing terminal 114 is set to $V_{bSERIES}=0.0V$, and while the shunt gate bias terminal 122 and the shunt backgate bias terminal 124 are each set to $V_{gSHUNT}=V_{bSHUNT}=-2.5V$ with use of a negative voltage source (not shown) which typically would be an on-chip negative voltage generator. Setting the biases in this manner ensures that the FETs of the series FET group switch 110 are fully on while the FETs of the shunt FET group switch 120 are properly off, within the reliability/breakdown limits of operation.

To connect the RF terminal 101 to ground 103 and put the switch 100 into shunt mode, the series gate biasing terminal 112 and the series backgate biasing terminal 114 are set to $V_{gSERIES}=V_{bSERIES}=-2.5V$ with use of the negative voltage source, while the shunt gate biasing terminal 122 is set to $V_{gSHUNT}=2.5V$, and while the shunt backgate bias terminal 124 is set to $V_{bSHUNT}=0.0V$. Setting the biases in this manner ensures that the FETs of the series FET group switch 110 are properly off while the FETs of the shunt FET group switch 120 are fully on, within the reliability/breakdown limits of operation.

This configuration biases each FET group switch in the forward or the reverse direction ensuring respectively low insertion loss and high isolation which are very important when dealing with high-power signal transmission.

Some of the drawbacks of the series shunt switch 100 of FIG. 1A are that it requires oscillators, charge pump circuitry, positive and negative voltage regulators, supply filtering including a negative supply filter which usually occupies a much larger area than a positive supply filter, and a pseudo-random bit sequence (PRBS) generator. The additional components can create noise, spurious tones, and spurious spectral emissions and tend to occupy a large percentage of IC (integrated chip) die area, and consume extra DC power.

Another example of a known series-shunt switch 150, this one according to a prior art approach utilizing DC blocking capacitors is presented in FIG. 1B. An RF terminal 151 is coupled along a series path 161 to a first blocking capacitor 181 coupled in series with a series FET group switch 160 in turn coupled in series with a second blocking capacitor 182 to an antenna 152, and is connected along a shunt path 171 to a third blocking capacitor 183 coupled in series with a shunt FET group switch 170 in turn coupled in series with a fourth blocking capacitor 184 to ground 153. Each FET group switch 160, 170 has a group of n-FET transistors connected in series with the respective path from the RF terminal 151 to the antenna 152 or from the RF terminal 151 to ground 153. Each FET group switch 160, 170 also has a respective associated group of source/drain resistors 165, 175. Each FET of the series and shunt FET group switches 160, 170 has a respective resistor of its associated group of source/drain resistors 165 coupled across its source and drain. All of the sources and drains of the FETs of the series FET group switch 160 are supplied with a series source/drain bias $V_{s/dSERIES}$ from a series source/drain biasing terminal 166. All of the sources and drains of the FETs of the shunt FET group switch 170 are supplied with a shunt source/drain bias $V_{s/dSHUNT}$ from a shunt source/drain biasing terminal 176. The actual mechanism for providing the biasing to the source/drains may be chosen from any number of known methods for providing biasing voltage. For the purposes of the switching function described herein, the chosen level of the biasing applied at each of the source/drains is the important factor.

The gates of the FETs of the series FET group switch 160 are biased by a series gate biasing terminal 162 with a voltage $V_{gSERIES}$, while gates of the FETs of the shunt FET group switch 170 are biased by a shunt gate biasing terminal 172 with a voltage $V_{gSHUNT}$. The backgates of the FETs of the series FET group switch 160 are biased by a series backgate biasing terminal 164 with a voltage $V_{bSERIES}$, while backgates of the FETs of the shunt FET group switch 170 are biased by a shunt backgate biasing terminal 174 with a voltage $V_{bSHUNT}$.

To connect the RF terminal 151 to the antenna 152 and put the switch 150 into series mode, the series gate biasing terminal 162 and the shunt source/drain bias terminal 176 are set to $V_{gSERIES}=V_{s/dHUNT}=2.5V$, while the series backgate biasing terminal 164, the shunt backgate biasing terminal 174, the series source/drain bias terminal 166 and the shunt gate bias terminal 172 are set to $V_{bSERIES}=V_{bSHUNT}=V_{s/dSERIES}=V_{gSHUNT}=0.0V$. Setting the biases in this manner ensures that the FETs of the series FET group switch 160 are fully on while the FETs of the shunt FET group switch 170 are properly off, within the reliability/breakdown limits of operation. In this mode of the series-shunt switch's 150 operation, the third blocking capacitor 183 blocks the RF terminal 151 from the 2.5 V DC shunt source/drain biasing, while the fourth blocking capacitor 184 blocks the 2.5 V DC shunt source/drain biasing from ground 153.

To connect the RF terminal 151 to ground 153, and put the switch 150 into shunt mode, the shunt gate biasing terminal 172 and the series source/drain bias terminal 166 are set to $V_{gSHUNT}=V_{s/dSERIES}=2.5V$, while the shunt backgate biasing terminal 174, the series backgate biasing terminal 164, the shunt source/drain bias terminal 176 and the series gate bias terminal 162 are set to $V_{bSHUNT}=V_{bSERIES}=V_{s/dSHUNT}=V_{gSERIES}=0.0V$. Setting the biases in this manner ensures that the FETs of the shunt FET group switch 170 are fully on while the FETs of the series FET group switch 160 are fully off, within the reliability/breakdown limits of operation. In this mode of the series-shunt switch's 150 operation, the first blocking capacitor 181 blocks the RF terminal 151 from the 2.5 V DC series source/drain biasing, while the second blocking capacitor 182 blocks the 2.5 V DC series source/drain biasing from the antenna 102.

As with the circuit depicted in FIG. 1A, this configuration biases each FET group switch in the forward or the reverse direction ensuring respectively low insertion loss and high isolation without the use of negative voltage generators.

Some of the drawbacks of the series-shunt switch 150 of FIG. 1B are that it often requires a DC-DC boost converter circuit (not shown), and requires that all terminals be blocked with an appropriately sized blocking capacitor in order to ensure flexible voltage settings. Integrated DC blocking capacitor's take up significant IC die area and may easily be damaged during ESD (ElectroStatic Discharge) events hampering the reliability and robustness of the circuit. Use of off chip capacitors also occupies a significant board area and can add significant cost. Although the blocking capacitors 181, 182, 183, 184, are effective in allowing all of the bias voltages to be positive and present a tolerable insertion loss, their use does, however, cause the switch 150 of FIG. 1B to exhibit more insertion loss than the switch 100 of FIG. 1A.

SUMMARY

According to one aspect, the invention provides for a high power switch comprising: a first transistor group switch comprising a plurality of first transistors of a first type, the first transistor group switch coupled along a signal path formed between a first end and a second end; and a second transistor group switch comprising a plurality of second transistors of a second type, the second transistor group switch coupled along a shunt path formed between a shunt end and at least one of the first and second ends of the signal path, wherein a drain and a source of at least one of the first transistors is held at a substantially similar biasing voltage as that applied to a drain and a source of at least one of the second transistors when the switch is in a series mode and when the switch is in a shunt mode.

According to another aspect the invention provides for a method of high power switching, the method comprising: providing a first transistor group switch comprising a plurality of first transistors of a first type, the first transistor group switch coupled along a signal path formed between a first end and a second end; and providing a second transistor group switch comprising a plurality of second transistors of a second type, the second transistor group switch coupled along a shunt path formed between a shunt end and at least one of the first and second ends of the signal path, biasing a drain and a source of at least one of the first transistors at a substantially similar biasing voltage as that applied to a drain and a source of at least one of the second transistors when the switch is in a series mode and when the switch is in a shunt mode.

BRIEF DESCRIPTION OF THE DRAWINGS

The features and advantages of the invention will become more apparent from the following detailed description of the preferred embodiment(s) with reference to the attached figures, wherein.

It is noted that in the attached figures, like features bear similar labels.

DETAILED DESCRIPTION

Figure 2:
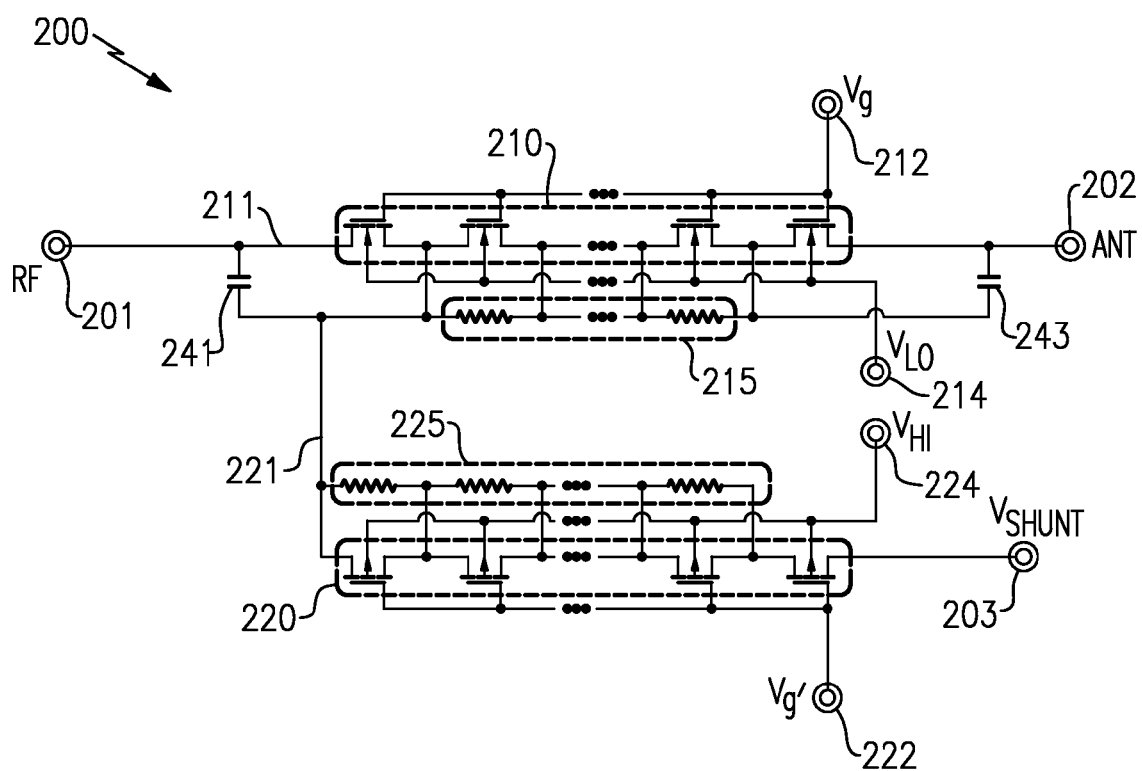
FIG. 2 is a circuit diagram illustrating a series-shunt switch according to an embodiment of the invention.

Referring to FIG. 2, a series-shunt switch 200 in accordance with a first embodiment of the invention will now be discussed in terms of its structure.

An RF terminal 201 is coupled along a series path 211 through a series n-FET group switch 210 to an antenna 202, and is connected along a shunt path 221 through a first blocking capacitor 241 in series with a shunt p-FET group switch 220 to an AC ground or shunt terminal 203. The series n-FET group switch 210 is made up of a plurality of n-type FET transistors, while the shunt p-FET group switch 220 is made up of a plurality of p-type FET transistors. Each FET group switch 210, 220 is connected in series with the respective path from the RF terminal 201 to the antenna 202 or from the RF terminal 201 to the shunt terminal 203. Each FET group switch 210, 220 also has a respective associated group of source/drain resistors 215, 225. Each n-FET of the series n-FET group switch 210, except for the last n-FET on the RF end of the series n-FET group switch 210 and the last n-FET on the antenna end of the n-FET group switch 210 has a respective resistor of the associated source/drain resistors 215 coupled across its source and drain. Each p-FET of the shunt p-FET group switch 220, except for the last p-FET on the shunt end of the p-FET group switch 220 has a respective resistor of the associated source/drain resistors 225 coupled across its source and drain.

The gates of the n-FETs of the series n-FET group switch 210 are biased by a series gate biasing terminal 212 with a voltage $V_g$, and the gates of the p-FETs of the shunt p-FET group switch 220 are biased by a shunt gate biasing terminal 222 with a voltage $V_g'$ which is set equal to the voltage applied to the series gate biasing terminal 212, namely, $V_g$. Although the value of $V_g$ will change as the switch 200 changes mode, the same value $V_g$ or voltage values substantially similar to $V_g$ will always be simultaneously applied to both the series gate biasing terminal 212 and the shunt gate biasing terminal 222 i.e. either $V_g=V_g'$ or $V_g V_g'$. At all times and in any mode of the switch's 200 operation, the backgates of the n-FETs of the series n-FET group switch 210 are biased by a series backgate biasing terminal 214 with a voltage $V_{LO}=0.0V$, while backgates of the p-FETs of the shunt p-FET group switch 220 are biased by a shunt backgate biasing terminal 224 with a voltage $V_{HI}=2.5V$. In the embodiment depicted in FIG. 2, the antenna 202 and RF terminal 201 are both pulled to 0.0V. The shunt terminal 203 is set to a voltage of VSHUNT which is set to $V_{HI}=2.5V$ and serves as AC ground.

To connect the RF terminal 201 to the antenna 202 and put the switch 200 into series mode, the series gate biasing terminal 212 and the shunt gate biasing terminal 222 are both set to $V_g=V_g'=2.5V$. Setting $V_g=V_g'$ to this value ensures that the n-FETs of the series n-FET group switch 210 are fully on while the p-FETs of the shunt p-FET group switch 220 are fully off, within the reliability/breakdown limits of operation. It is noted that as a result of this biasing configuration, all of the sources/drains of the n-FETs and of the p-FETs of the FET group switches 210 220 are biased at 0.0V, with only the exception of the source/drain of the shunt p-FET group switch 220 adjacent the shunt terminal 203.

To connect the RF terminal 201 to the shunt terminal 203 and put the switch 200 into shunt mode, the series gate biasing terminal 212 and the shunt gate biasing terminal 222 are both set to $V_g=V_g'=0.0V$. Setting $V_g=V_g'$ to this value ensures that the n-FETs of the series n-FET group switch 210 are fully off while the p-FETs of the shunt p-FET group switch 220 are fully on, within the reliability/breakdown limits of operation. It is noted that as a result of this biasing configuration, all sources/drains of the n-FETs and of the p-FETs of the FET group switches 210 220 are biased at 2.5 V, with only the exception of the source/drain of the series n-FET group switch 210 adjacent the RF terminal 201 and the source/drain of the series n-FET group switch 210 adjacent the antenna 202.

As with the configurations of the prior art, this embodiment according to the invention fully biases each FET group switch in the forward or the reverse direction ensuring respectively low insertion loss and high isolation which are very important when dealing with high-power signal transmission. Moreover, the drawbacks of negative voltage generation and blocking capacitors along the series path are mitigated.

Figure 1A:
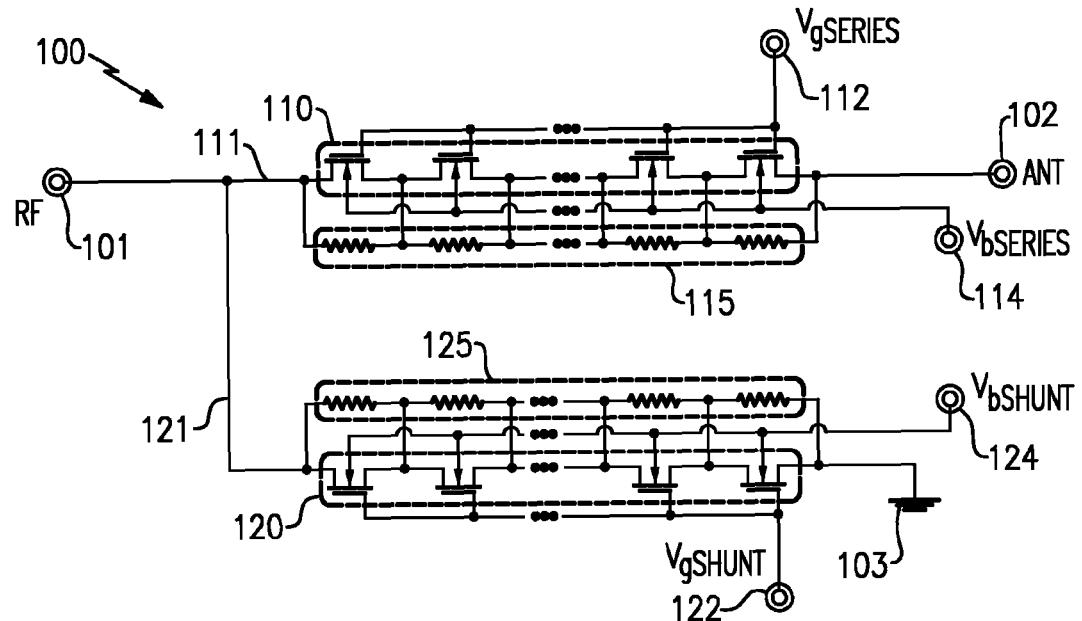
FIG. 1A is a circuit diagram illustrating a prior art implementation of a series-shunt switch utilizing negative biasing.

Unlike the series-shunt switch 100 of FIG. 1A which utilizes a negative power supply, the series-shunt switch 200 of FIG. 2 utilizes only positive voltage supplied at 2.5V or 0.0V. The drawbacks of the series shunt switch 100 of FIG. 1A, namely that it requires oscillators, charge pump circuitry, a negative voltage regulator, large area occupying negative supply filtering, and pseudo-random bit sequence (PRBS) generator are avoidable. The absence of additional components means that noise, spurious tones, and spurious spectral emissions that they create, the large percentage of IC (integrated chip) die area they tend to occupy, and the extra DC power they would consume are also avoided.

Figure 1B:
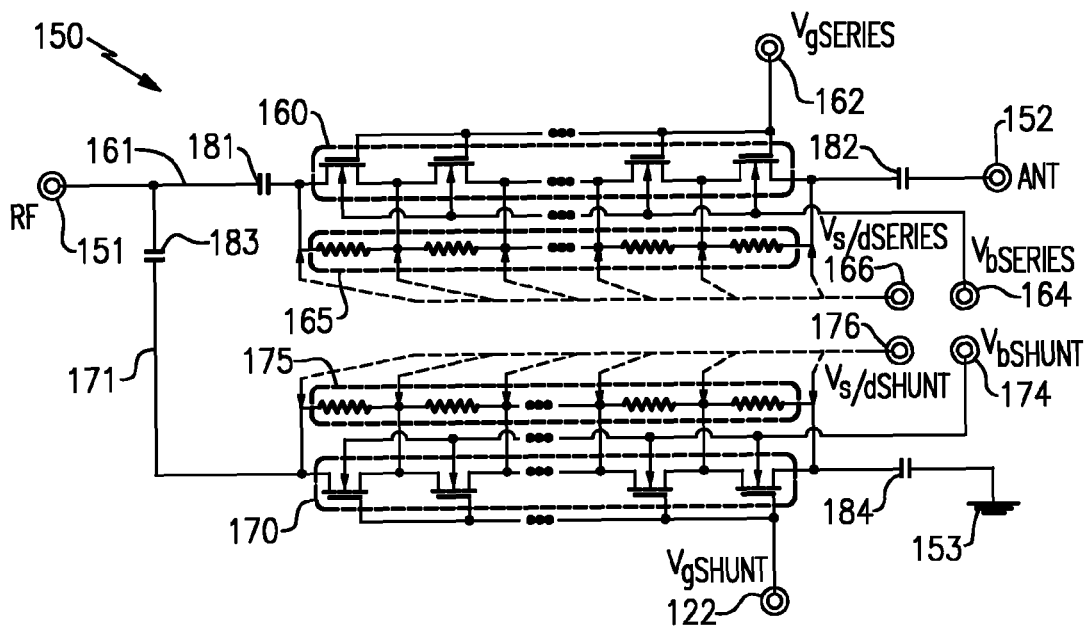
FIG. 1B is a circuit diagram illustrating a second prior art implementation of a series-shunt switch utilizing blocking capacitors.

Unlike the series-shunt switch 150 of FIG. 1B, which utilizes blocking capacitors along the series path 181, the series shunt switch 200 of FIG. 2 utilizes blocking capacitors only to isolate RF terminal 201 and the antenna 202 from the nonzero effective biasing of the source/drains of the n-FETs of the series n-FET group switch 210 and the p-FETs of the shunt p-FET group switch 220 which occurs in shunt mode. Since a signal traversing the series path 211 does not encounter a blocking capacitor, the insertion loss along the series path 211 of the series-shunt switch 200 of FIG. 2 is less than that of the series path 161 of the known series-shunt switch 150 of FIG. 1B. The absence of blocking capacitors along the series path typically also improves switching times. The blocking capacitors 241, 243 of the switch 200 of FIG. 2 also do not bear the full brunt of any ESD event since the source/drain breakdown of the n-FETs at the ends of the series n-FET group switch 210 clamps the voltage of the blocking capacitors 241, 243 so as to protect them. As such, the switch 200 is much more robust to forms of ESD event damage. The switch 200 also does not require a DC-DC boost converter circuit as required by prior art configurations. In addition to requiring fewer blocking capacitors, the switch 200 of FIG. 2 may use blocking capacitors 241, 243 which are not as large as those 181, 182, 183, 184 of the known switch 150 of FIG. 1B. Reduction in both the size and number of blocking capacitors translates to reduction in IC die area usage for integrated blocking capacitors and/or reduction in board area and cost imposed by the use of off-chip capacitors.

The switch 200 in addition to reducing or avoiding altogether the various drawbacks of known switch architectures described above also is controllable in an elegant and uncomplicated manner, namely, by control of the gate biasing voltage $V_g=V_g'$. When it is desired that the switch 200 function in series mode, $V_g=V_g'$ is set to 2.5V and when it is desired that the switch 200 function in shunt mode, $V_g=V_g'$ is set to 0.0V. Since isolation along the shunt path 221 is not as important as that along series path 211, the p-FETs may be used along the shunt path without any serious detriment to the circuit's 200 performance. As long as the p-FET transistors are situated along the insertion loss insensitive paths, and as long as they provide a relatively low impedance to an AC ground, they may be advantageously used to allow biasing voltages on the drain and source of the various FET group switches to move between supply and ground.

Although each embodiment has been described as utilizing FET group switches comprising n-type and p-type MOSFETs it should be understood that other implementations may utilize any suitable number and combination of complementary n-type and p-type transistor switches, including unipolar devices such as standard CMOS, SOI, CMOS, MOS with depletion mode devices, pHEMT, MESFET, JFET, etc.

Although in the embodiment of FIG. 2, the same voltage $V_g$ is shown as being applied to all the gates of the FETs of the various FET group switches, in some embodiments the bias voltage applied to the gates of the p-FETs of the shunt p-FET group switch 220, namely, $V_g'$ may only be substantially similar or approximately equal to the voltage applied to the gates of the n-FETs of the series n-FET group switch 210, namely, $V_g$, i.e. $V_g' \approx V_g$.

Although in embodiments described above the high voltage level for biasing has been chosen to be 2.5V, other values of positive voltage for VHI and the gate biasing voltages may be appropriate in specific instances.

The embodiments presented are exemplary only and persons skilled in the art would appreciate that variations to the embodiments described above may be made without departing from the spirit of the invention. The scope of the invention is solely defined by the appended claims.

What is claimed is:

1. A series-shunt switch comprising:
  a series switch including a plurality of first transistors coupled along a signal path formed between a radio frequency (RF) terminal and an antenna; and
  a shunt switch including a plurality of second transistors coupled along a shunt path formed between a shunt end and one of the RF terminal and the antenna, the first and second transistors being complementary, and gates of the first and second transistors being biased with a substantially similar biasing voltage when operating in a series mode and in a shunt mode.

2. The series-shunt switch of claim 1 wherein the gates of the first and second transistors are biased with a positive voltage when operating in the series mode, and the gates of the first and second transistors are biased to ground when operating in the shunt mode.

3. The series-shunt switch of claim 2 wherein a drain and a source of at least one of the first transistors and a drain and a source of at least one of the second transistors are biased to ground when operating in the series mode, and the drain and the source of the at least one of the first transistors and the drain and the source of the at least one of the second transistors are biased with the positive voltage when operating in the shunt mode.

4. The series-shunt switch of claim 1 wherein when operating in any one of the series mode and the shunt mode, backgates of the second transistors are biased with a positive voltage, and backgates of the first transistors are biased to ground.

5. The series-shunt switch of claim 1 wherein the substantially similar biasing voltage is a same biasing voltage.

6. The series-shunt switch of claim 1 wherein the first transistors are n-FETs and the second transistors are p-FETs.

7. The series-shunt switch of claim 1 wherein the shunt end is coupled to an AC ground signal.

8. The series-shunt switch of claim 1 wherein biasing the first and the second transistors is performed exclusively with a positive supply voltage and ground.

9. The series-shunt switch of claim 1 wherein the series switch further includes a first plurality of first source/drain resistors and the shunt switch further includes a second plurality of source/drain resistors, at least one first transistor configured with a source/drain resistor of the first plurality of source/drain resistors coupled across its source, and drain and at least one second transistor configured with a source/drain resistor of the second plurality of source/drain resistors coupled across its source and drain.

10. The series-shunt switch of claim 1 further comprising blocking capacitors coupled other than along the signal path to protect the signal path from biasing of the first and the second transistors.

11. A method of high power switching, the method comprising:
  providing a high power switch having a series switch including a plurality of first transistors and coupled along a signal path formed between a first end and a second end, and having a shunt switch including a plurality of second transistors and coupled along a shunt path formed between a shunt end and one of the first and second ends; and
  biasing gates of the first and the second transistors with a substantially similar biasing voltage when the high power switch operates in a series mode and in a shunt mode, the first and the second transistors being complementary.

12. The method of claim 11 further comprising:
  biasing with a positive voltage gates of the first transistors and gates of the second transistors when the high power switch operates in the series mode; and
  biasing to ground the gates of the first transistors and the gates of the second transistors when the high power switch operates in the shunt mode.

13. The method of claim 12 further comprising:
  biasing to ground sources and drains of the first transistors and sources and drains of the second transistors when the high power switch operates in the series mode; and
  biasing with the positive voltage the sources and the drains of the first transistors and the sources and the drains of the second transistors when the high power switch operates in the shunt mode.

14. The method of claim 13 further comprising:
  biasing to ground backgates of the first transistors when the high power switch operates in the series mode and in the shunt mode; and
  biasing with the positive voltage backgates of the second transistors when the high power switch operates in the series mode and in the shunt mode.

15. The method of claim 11 further comprising biasing gates of the first and the second transistors with a same biasing voltage when the high power switch operates in a series mode and in a shunt mode.

16. The method of claim 11 wherein the first transistors are n-FETs and the second transistors are p-FETs.

17. The method of claim 11 wherein the second transistors exhibit a higher insertion loss than the first transistors.

18. The method of claim 11 wherein biasing the first and the second transistors is performed exclusively with a positive supply voltage and ground.

19. The method of claim 11 further comprising coupling a resistor across a source and a drain of at least one first transistor and coupling another resistor across a source and a drain of at least one second transistor.

20. The method of claim 11 further comprising coupling blocking capacitors other than along the signal path to protect the first and the second ends of the signal path from biasing of the first and the second transistors.

* * * * *